United States Patent [19]
Marsh et al.

[11] 3,897,273
[45] July 29, 1975

[54] PROCESS FOR FORMING ELECTRICALLY ISOLATING HIGH RESISTIVITY REGIONS IN GaAs

[75] Inventors: Ogden J. Marsh, Woodland Hills; Robert G. Hunsperger, Malibu, both of Calif.

[73] Assignee: Hughes Aircraft Company, Culver City, Calif.

[22] Filed: Nov. 6, 1972

[21] Appl. No.: 304,028

[52] U.S. Cl. .................................... 148/1.5; 357/91
[51] Int. Cl. ............................................ H01l 7/54
[58] Field of Search ....................... 148/1.5; 317/235

[56] References Cited

UNITED STATES PATENTS

| | | | |
|---|---|---|---|
| 3,515,956 | 6/1970 | Martin et al. | 317/235 X |
| 3,586,542 | 6/1971 | MacRae | 148/1.5 |
| 3,663,308 | 5/1972 | Davey | 148/1.5 |
| 3,666,548 | 5/1972 | Brack et al. | 148/1.5 UX |
| 3,736,192 | 5/1973 | Tokuyama et al. | 148/1.5 |

OTHER PUBLICATIONS

"Zn and Te Implantations into GaAs," Mayer et al., J. Appl. Phys., Vol. 38, No. 4, 15 Mar. 1967, pp. 1975–1976.

*Primary Examiner*—L. Dewayne Rutledge
*Assistant Examiner*—J. M. Davis
*Attorney, Agent, or Firm*—William J. Bethurum; William H. MacAllister

[57] ABSTRACT

Process for dielectrically isolating selected active regions of a semiconductive body, such as GaAs, by accelerating heavy particles, such as argon ions, into the body under the influence of relatively low accelerating voltages. The internal damage in the semiconductive body caused by the above particle bombardment creates a high resistivity defect compensated barrier region in the body which will not anneal out (become lower in resistivity) unless subjected to relatively high temperatures on the order of 800°C or greater, and this barrier region provides electrical isolation between the above active regions.

13 Claims, 6 Drawing Figures

PROCESS FOR FORMING ELECTRICALLY ISOLATING HIGH RESISTIVITY REGIONS IN GaAs

FIELD OF THE INVENTION

This invention relates generally to the formation of electrical isolation regions in semiconductive structures, and more particularly to an improved, dielectrically isolated gallium arsenide structure and fabrication process therefor using ion implantation techniques.

BACKGROUND

The necessity for selectively forming electrically isolated regions in certain types of semiconductive structures, such as monolithic integrated circuits (IC's), is generally well-known. In the absence of providing some type of electrically insulating barrier between closely spaced semiconductive devices and/or other IC components fabricated in a common semiconductive substrate, undesirable leakage currents will flow between these devices or components and degrade the electrical performance of the structure, if not render it totally inoperable.

PRIOR ART

In the past, for example, at least to well-known types of "island" isolation processes have been used in the fabrication of silicon monolithic integrated circuit: (1) One of these is the well known PN junction isolation process wherein diffused PN junction barriers are formed, usually in an epitaxial layer of a silicon structure, to provide electrical isolation between devices and components subsequently formed in the epitaxial layer. (2) The second process is the dielectric island isolation process wherein planar barriers of a suitable insulating material, such as silicon dioxide ($SiO_2$), are formed between a common substrate layer and individual single crystal islands of a suitable semiconductive material, such as silicon. Active and passive components may then be fabricated in these islands using conventional silicon processing techniques.

For certain applications, both of the above prior art processes have proven quite satisfactory, but each process has certain inherent disadvantages and limitations. In the PN junction isolation process, for example, the PN junction capacitance provides a finite amount of AC coupling in the structure, especially between adjacent, relatively low resistivity P+ and N+ regions, and such AC coupling is to be avoided in many high frequency monolithic IC applications.

The above-described dielectric island isolation process has been used successfully to eliminate the above problem of large PN junction capacitances. These planar $SiO_2$ insulating barriers have a much lower coupling capacitance than do the narrow, low resistivity diffused PN junctions. On the other hand, this dielectric island isolation process requires a relatively large number of individual semiconductor processing steps, which steps often include the tedious and low yield etch-out and back-fill processes for mechanically removing the regions of a semiconductor substrate where the single crystal islands are to be located. Thus, this dielectric island isolation process does not readily lead itself to the economic, rapid and high yield fabrication of commercial semiconductive structures.

In the fabrication of dielectrically isolated gallium arsendie structures, another type of isolation process has been proposed which offers certain advantages over the above prior art processes which have been used predominantly in the silicon technology. In this latter process, hydrogen ions (protons) are accelerated into selected regions of a gallium arsenide substrate to convert these regions to high resistivity P or N type semeinsulating material. The term "semi-insulating" material as used herein means a semiconductor whose resistivity is between about $10^4$ and $10^9$ ohm.centimeters. These regions serve as electrical isolation barriers between adjacent semiconductive devices or other components within the GaAs structure, and such a process is described, for example, by A. G. Foyt et al. in Solid State Electronics, January 1969.

This latter proton beam process is potentially capable of forming isolation barriers having a lower capacitance than that of the above PN junction isolation barriers, and this process is also potentially capable of being carried to completion much quicker and at higher yields than is the planar barrier dielectric island isolation processes of the prior art. On the other hand, however, proton beam isolation processes require very high particle accelerating voltages, on the order of several hundred KeV, in order to impart the required high level of acceleration to the relatively light proton ion which is necessary for penetration depths of several microns. Furthermore, in prior processes using proton bombardment to form dielectric isolation barriers in GaAs, it has been observed that the annealing of these GaAs structures at a relatively low temperature, on the order of 400°C, tends to convert previously formed high resistivity barriers back to their lower resistivity states. This latter "annealing out" phenomenon, which is not fully understood, imposes a serious limitation on the use and application of prior art GaAs structures formed using the latter process.

THE INVENTION

The general purpose of this invention is to provide an improved particle bombardment dielectric isolation process which overcomes the above-mentioned disadvantages associated with the prior art processes designated (1) and (2) above, while simultaneously eliminating the requirement for very high level particle accelerating voltages and eliminating the above problem of high resistivity annealing out at certain elevated temperatures. To attain this purpose, certain heavy charged particles, such as argon ions, are utilized in a particle bombardment process wherein relatively low accelerating voltages on the order of 20 KeV may be utilized to inject these particles into selected surface regions of a GaAs semiconductive body and therein damage the internal monocrystalline lattice structure. The required depth of the isolation regions, which is on the order of several microns or greater, is produced by, among other things, heating the GaAs to a moderate temperature of between about 200-500°C during ion implantation. In this manner, the lattice defects produced at the GaAs surface will diffuse to greater depths into the body of the GaAs crystal. The above crystal damage will raise the resistivity of epitaxial GaAs by an amount sufficient to provide good electrical isolation barriers between adjacent active or passive semiconductive devices, and these barriers will not anneal out when subjected to temperatures less than about 800°C.

Accordingly, an object of the present invention is to provide a new and improved particle bombardment dielectric isolation process for fabricating semiconductive structures and for providing good low and high frequency electrical isolation, Another object is to provide a process of the type described which may be carried out at relatively low level particle accelerating voltages.

Another object is to provide a process of the type described in which the semi-insulating barriers formed do not anneal out at temperatures below about 800°C.

Another object is to provide a process of the type described which is capable of producing semi-insulating isolation barriers having a lower barrier capacitance than that of PN junction isolation barriers.

Another object is to provide a process of the type described which can be carried out at much lower temperatures than those diffusion temperatures associated with PN junction isolation diffusions.

A further object is to provide a process of the type described which may be carried to completion in considerably fewer processing steps than those required in the fabrication of planar dielectric island isolation barrier devices.

A further object is to provide a process of the type described wherein very sharp semi-insulating - semiconducting boundaries are formed in GaAs semiconductive structures, thereby reducing the substrate area required for forming these isolation barriers.

DRAWINGS

GENERAL PROCESS DESCRIPTION

Figure 1:
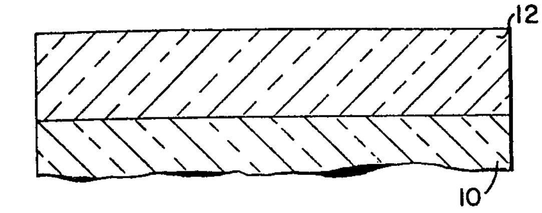
FIG. 1 is a diagrammatic cross-sectional view illustrating a first step in the process according to the invention.

Referring now to FIG. 1, there is shown an $N^-$ high resistivity semi-insulating substrate 10 upon which an $N^+$ epitaxial layer of gallium arsenide, GaAs, is deposited using, for example, the arsenic trichloride process wherein arsenic trichloride, $AsCl_3$, is reacted with elemental gallium to precipitate out GaAs and form the epitaxial layer 12.

In accordance with the invention, as shown in FIGS. *2a* and *2b*, a plurality of single crystal islands 14, 16, 18 and 20 are formed in the epitaxial layer 12 by the selective bombardment of the epitaxial layer 12 with a scanned or masked ion beam 22 which sequentially forms, respectively, the semi-insulating channel regions 28, 30 and 32 in the epitaxial layer 12 surrounding these islands. Advantageously, argon ions are utilized in a preferred embodiment of the invention, and these ions are accelerated under the influence of a suitable electric field so that they penetrate beneath the surface of the epitaxial layer 12. Such implantation is carried out in a suitable dosage, generating electrically compensating defects which diffuse inwardly toward the substrate 10 to thus form the above island. During this ion implantation step, the GaAs structure of FIG. *2b* is heated at an elevated temperature, typically from between 200°C–500°C, to enhance this diffusion of the compensating defects into the epitaxial layer 12. For a general discussion of ion implantation, including the ion implantation equipment of the type used in practicing the invention, reference can be made to the textbook Ion Implantation in Semiconductors by James W. Mayer et al., Academic Press, 1970.

Although the specific Examples below of the actual reductions to practice of the invention use the inert noble gas argon, the ion implantation data available to us indicates that other heavy ions, both of the inert variety as well as the electrically active variety, can be used in practicing the invention. For example, from strictly a crystal damage standpoint and using the relatively low accelerating voltages described herein, any ion heavier than the atomic weight of the neon ion (and including the neon ion) will provide sufficient damage in the crystal structure to raise the resistivity thereof to $10^7$ ohm.centimeters or greater. Therefore, as used herein the term "heavy ion" is intended to mean any ion, including neon, whose atomic weight is greater than that of neon. Such term would therefore include the noble or rare earth inert gases argon, krypton and xenon as well as other ionized elements heavier in atomic weight than neon, but which tend to affect the conductivity of the semiconductive material being bombarded. For example, cadmium and zinc have been implanted into GaAs to damage the GaAs crystal and thus raise the resistivity in certain barrier regions thereof to a value greater than $10^7$ ohm.centimeters These barrier regions have been measured at 1–2 microns deep into the GaAs epitaxial layer. However, these elements have been found to produce a very thin P type layer on the surface of N type GaAs on the order of 100–300 angstroms in thickness. And for this reason, the heavy inert gases noted above are preferred to the Zn and Cd for certain barrier isolation applications. Similarly, when sulfur, selenium or tellurium ions are implanted to P type GaAs, they have been found to leave a very thin N type surface layer on the crystal on the order of 200–300 angstroms. However, in both of the above cases where the GaAs surface conductivity is affected, it would be relatively simple to lap or polish the GaAs wafer to thereby remove this very thin outer surface layer, leaving a GaAs epitaxial layer with uncovered islands therein which are totally surrounded by the high resistivity barrier material. Therefore, it will be appreciated by those skilled in the art that the present invention is not limited to the use of argon ions or to one of the other suitable heavy inert ions if the other processing requirements can tolerate the P and N type electrical characteristics of other ions suitably heavy to produce sufficient damage in the semiconductor crystal to raise the barrier layer resistivity thereof by a prescribed amount.

The defects created in the epitaxial layer 12 during ion implantation are apparently the result of the electron vacancies of one of the components of the semiconductive material. For example, in GaAs, the defects are believed to be arsenic vacancy complexes which act as compensating centers to "tie up" the shallow donors or acceptors used to dope the epitaxial layer or substrate.

Figure 2A:
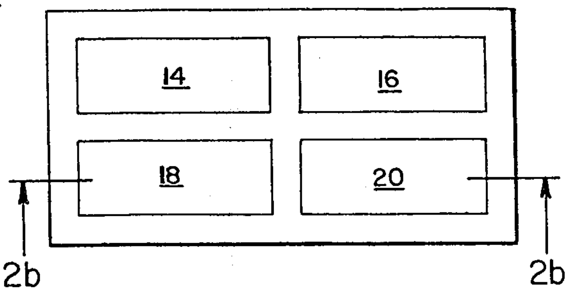
FIGS. 2a and 2b are plan and front views, respectively, of the structure of FIG. 1 after ions have been implanted in the epitaxial layer thereof.

The structure in FIG. 2 may then be further processed using conventional monolithic semiconductor processing techniques, including conventional ion implantation doping, wherein, for example, an NPN gallium arsenide transistor 34 is formed in one of the single crystal islands 18 and another, passive component, such as an ion implanted resistor 36, is formed in another of the single crystal islands 20. The formation of these active and passive components 34 and 36, respectively, may be carried out using conventional masking and ion implantation techniques wherein, for example, a suitable surface insulating and passivating coating 38, such as $SiO_2$, is formed as shown on the upper surface of the epitaxial layer 12 and is utilized for the masking against P or N type impurities implanted into the gallium arsenide epitaxial layer 12. The $SiO_2$ insulating mask 38 may also be used to support a layer of ohmic contact metallization 40 which is subsequently deposited using conventional metal evaportation techniques on the exposed surfaces of the emitter region of the gallium arsenide transistor 34 and on one end of the ion implanted resistor 36.

Figure 4A:
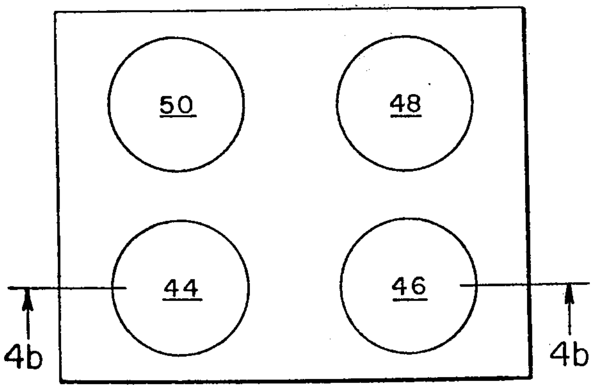
FIGS. 4a and 4b illustrates, in diagrammatic cross-section, a self-masking process for defining the geometries of the isolation regions fabricated according to the invention.
Figure 4B:
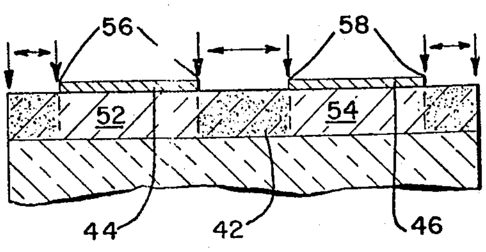

Referring now to FIGs. 4*a* and 4*b*, there is shown a high resistivity N-type gallium arsenide substrate 41 upon which an N-type epitaxial gallium arsenide layer 42 has been deposited; and further, a plurality of Schottky barrier metal mask electrodes 44, 46, 48, and 50 have been selectively spaced as shown on the upper surface of the epitaxial GaAs layer 42. These Schottky barrier electrodes form Schottky barrier junctions at the metal-GaAs interface as is well-known, and these metal electrodes also serve as a mask against the argon ions which are accelerated into the exposed areas of the epitaxial layer 42 to completely isolate the plurality of Schottky barrier diode regions 52 and 54. This isolation reduces the fringing electric fields at the edges 56 and 58 of the Schottky barrier junctions, and such reduction in electric field intensity at these points serves to increase the breakdown voltage of the Schottky barrier diodes. Comparative measurements for these breakdown voltages before and after ion implantation are given in the Example 2 below.

Thus, the present invention is not limited to the per se formation of electrically isolated single crystal islands, but it may also be extended in the above novel manner to the formation of a plurality of discrete Schottky barrier devices as shown in FIG. 4. The masking technique illustrated in FIG. 4 not only provides the Schottky barrier junction formation and the ohmic contact functions, but it also simultaneously provides the function of masking against ion implantation and preventing argon ions from entering the active regions 52 and 54 of the Schottky barrier diodes. Thus, the present process does not require separate steps for ion beam masking and for forming Schottky electrodes, and this results in time and cost savings and an increased device yield.

The following examples are specific and separate process descriptions for practicing the invention:

EXAMPLE 1

An $N^-$ substrate of 10 ohm.cm. or greater gallium arsenide, GaAs, of approximately 20 mils in thickness is lapped and polished on one side thereof and then transferred to an epitaxial reactor wherein an $N^+$ GaAs epitaxial layer of approximately $10^{-1}$ ohm.cm. resistivity and of approximately 10 microns thickness is desposited on the substrate. One epitaxial process which has advantageously been used in the formation of this epitaxial layer involves bubbling $H_2$ has through an $AsCl_3$ bubbler held at room temperature and then passing this $H_2$ gas from the bubbler to a Ga source furnace of an epitaxial reactor in which liquid gallium is located in a boat in a first zone of the reactor. After the Ga source becomes saturated with the As (i.e., about 8% As at 850°C) brought into the source furnace by the carrier gas $H_2$, a vapor consisting of GaC1 and As proceeds down to the seed zone of the reactor which is maintained at about 750°C. Here, GaAs deposits on the surface of a GaAs substrate as illustrated in FIG. 1.

Figures 2B, 3:
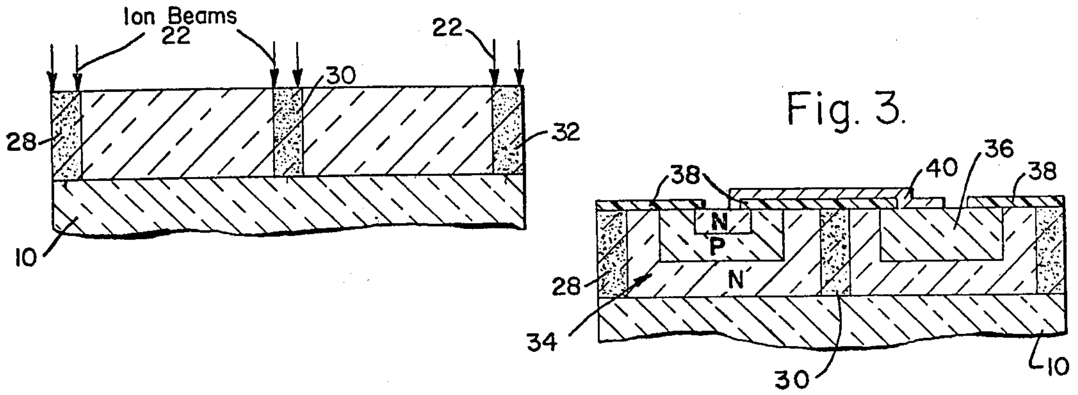
FIG. 3 illustrates a typical monolithic integrated circuit interconnection between adjacent dielectrically isolated devices on the same chip.

After cooling, the epitaxial structure of FIG. 1 is transferred to an ion implantation chamber (not shown) wherein the structure is heated to approximately 400°C to enhance the vacancy formation in the crystal lattice of the epitaxial layer 12 during ion implantation. After reaching this temperature, an argon ion beam is scanned at 20 KeV, as shown in FIG. 2*b*, and focused onto selected areas of the upper surface of the $N^+$ epitaxial layer 12, so that a relatively heavy dose of argon ions in the order of $10^{16}$atoms/cm$^2$ penetrates the structure and generates defects which diffuse to a depth equal to or greater than the thickness of the epitaxial layer 12. The regions 28, 30 and 32 in FIG. 2*b* are approximately 10 microns wide, and at least 10 microns deep, and the resistivity of these regions is raised by the present process to approximately $10^7$ ohm·cm. This prevents any significant AC or DC coupling through these electrical isolation or barrier regions which completely surround the discrete islands 14, 16, 18, and 20, as shown. If, for example, the two isolated regions 14 and 18 have adjacent edges 3 millimeters long, the coupling capacitance between these islands and at these edges will be approximately 0.3 picofarads and will present an AC coupling impedance of greater than 400 Ω to 1GHz signals.

EXAMPLE 2

An $N^+$ gallium arsenide substrate of $1.8 \times 10^{-3}$ ohm·cm. and of approximately 20 mils in thickness was lapped and polished on one side thereof and then transferred to an epitaxial reactor wherein an $N^{--}$ GaAs epitaxial layer of approximately 2.3 microns thickness and approximately $2 \times 10^{-1}$ ohm·cm. was grown using a standard vapor epitaxial growth process, such as the epitaxial process described in Example 1 above. Next, an array of Schottky barrier electrodes 44, 46, 48, and 50 as shown in FIG. 4 was formed on the surface of the epitaxial layer by depositing thin film aluminum dots of approximately 6 mils diameter using standard vacuum evaporation techniques. At this point in the process, measurements of the electrical properties of these Schottky barrier diodes revealed that they had a reverse breakdown voltage of approximately 22 volts. Such breakdown voltage is partly a result of the high intensity field regions at the edges 56 and 58 of the diodes. The above epitaxial structure was then transferred to an ion implantation chamber (not shown) and preheated to approximately 400°C. After reaching this temperature, a 20 KeV argon ion beam was scanned over the entire upper surface of the apitaxial layer 42 to penetrate the unmasked portions of the epitaxial layer with a dose of $1 \times 10^{16}$ ions/cm$^2$. In the ion-bombarded portions, defects in the GaAs crystal lattice were diffused to a depth equal to or greater than the thickness of the epitaxial layer which was 2.3 microns deep. These defects created electrically compensating vacancies in the atomic lattice of the GaAs which raised the resistivity of the isolation regions surrounding the diodes to approximately $10^7$ ohm cm. or higher, thereby increasing the reverse breakdown voltage of the Schottky barrier diodes formed. Reverse breakdown voltage measurements were again taken on these diodes, and it was found that the breakdown voltage of these devices had been increased to 52 volts. Such increase is a result of substantially reducing the intensity of the fringing fields at points 56 and 58 by the creation of the high resistivity regions now surrounding the diodes.

The present invention is not limited by the specific examples given above, and obviously devices other than Schottky barrier diodes could be isolated in a common substrate using the novel concepts of this invention. For example, it might be desirable to use the above ion implantation and masking techniques in the isolation of a plurality of radiation photodetectors which are fabricated in a monolithic array on a single common substrate. The ohmic contact metallization used for the detectors in this array could advantageously be used for a metal mask to define the specific geometry of the isolation barriers for the array. Thus, the novel concepts of this invention can be utilized conceivably in a wide variety of semiconductor devices fabricated in a common substrate.

What is claimed is:

1. A process for forming electrical isolation barriers in gallium arsenide which comprises accelerating heavy ions with an atomic weight equal to or greater than the atomic weight of neon into selected regions of gallium arsenide and at accelerating voltages of approximately 20 KeV or less, while simultaneously heating said GaAs at elevated temperatures between about 200°C–500°C, said ions penetrating the surface of said GaAs to create arsenic vacancies therein, and thereafter diffusing deeper into the GaAs crystal under the influence of said elevated temperature to tie up extra electrons in said GaAs crystal and create arsenic vacancy complexes which raise the resistivity in said selected regions to the order of about $10^7$ ohm centimeters or higher, whereby the resistivity of said isolation barriers formed will not be significantly lowered by annealing at temperatures below about 800°C, and the resistivity of said barriers will be sufficient to prevent any significant AC or DC coupling therethrough.

2. The process defined in claim 1 wherein said heavy ions are argon ions.

3. The process defined in claim 1 wherein said heavy ions are selected from the group consisting of argon, neon, krypton and xenon ions.

4. A process for forming electrically isolated islands of single crystal gallium arsenide which includes:

a. providing a substrate of suitable semiinsulating material, b. forming a single crystal layer of gallium arsenide on said substrate, and c. bombarding regions of said single crystal gallium arsenide layer with relatively heavy ions with an atomic weight equal to or greater than the atomic weight of neon and under the influence of an accelerating voltage of approximately 20 KeV or less, while simultaneously heating said GaAs at elevated temperatures between about 200°C – 500°C, said ions penetrating the surface of said GaAs to create arsenic vacancies therein, and thereafter diffusing deeper into the GaAs crystal under the influence of said elevated temperature to tie up extra electrons in said GaAs crystal and create arsenic vacancy complexes which raise the resistivity in said selected regions to the order of about $10^7$ ohm centimeters, or higher, whereby said resistivity will not be substantially altered when subjected to annealing temperatures below about 800°C and said barriers will prevent any significant AC or DC coupling therethrough.

5. The process defined in claim 4 wherein said heavy ions are argon ions.

6. The process defined in claim 4 wherein said heavy ions are selected from the group consisting of argon, neon, krypton and xenon ions.

7. The process defined in claim 4 which, prior to and during the ion bombardment of said epitaxial gallium arsenide layer, includes heating said substrate and epitaxial layer to approximately 400°C to thereby enhance the creation of vacancy complexes in said epitaxial layer and thereby raise the resistivity thereof.

8. The process defined in claim 7 wherein said heavy ions are selected from the group consisting of argon, neon, krypton and xenon ions.

9. The process defined in claim 4 which, prior to the ion bombardment of said epitaxial gallium arsenide layer, includes:

a. forming a plurality of spaced metal electrodes on said epitaxial layer for making ohmic contact to devices thereunder; and b. using said electrodes as a mask against ion implantation to thereby provide the selective bombardment of said epitaxial layer and the electrical isolation of said devices.

10. The process defined in claim 4 which, prior to the ion bombardment of said epitaxial gallium arsenide layer, includes forming a plurality of spaced Schottky barrier electrodes on the surface of said epitaxial layer to thereby form a plurality of Schottky barrier diodes in said epitaxial layer, whereby said electrodes serve as a mask against ion implantation into said epitaxial layer, leaving a plurality of electrically isolated Schottky barrier diodes therein exhibiting high reverse breakdown voltages.

11. The process defined in claim 10 wherein said inert ions are argon ions.

12. The process defined in claim 10 wherein said heavy ions are selected from the group consisting of argon, neon, krypton and xenon ions.

13. The process defined in claim 12 which, prior to and during the ion bombardment of said epitaxial gallium arsenide layer, includes heating said substrate and epitaxial layer to approximately 400°C to thereby enhance the creation of vacancy complexes in said epitaxial layer and thereby raise the resistivity thereof.

* * * * *